(12) United States Patent
Hsu et al.

(10) Patent No.: US 10,338,109 B2
(45) Date of Patent: Jul. 2, 2019

(54) POWER CABLE MEASUREMENT DEVICE AND MEASUREMENT METHOD THEREOF

(71) Applicant: Industrial Technology Research Institute, Hsin-Chu (TW)

(72) Inventors: Wei-Hung Hsu, Taipei (TW); Lien-Yi Cho, Miaoli County (TW); Pei-Fang Liang, Hsinchu County (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 603 days.

(21) Appl. No.: 14/843,401

(22) Filed: Sep. 2, 2015

(65) Prior Publication Data
US 2017/0023625 A1 Jan. 26, 2017

(30) Foreign Application Priority Data
Jul. 21, 2015 (TW) .............................. 104123588 A

(51) Int. Cl.
*G01R 19/25* (2006.01)
(52) U.S. Cl.
CPC ..... *G01R 19/2506* (2013.01); *G01R 19/2513* (2013.01)
(58) Field of Classification Search
CPC .................. G01R 19/2506; G01R 19/2513
See application file for complete search history.

(56) References Cited

U.S. PATENT DOCUMENTS

| 5,473,244 A | 12/1995 | Libove et al. |
| 6,373,238 B2 | 4/2002 | Lewis et al. |
| 6,429,661 B1 * | 8/2002 | Schweitzer, Jr. .... G01R 31/023 |
| | | 324/117 R |

(Continued)

FOREIGN PATENT DOCUMENTS

| CN | 201909811 | 7/2011 |
| CN | 102192699 | 9/2011 |

(Continued)

OTHER PUBLICATIONS

Wijeweera, G. et al., "Micromachined Electric-Field Sensor to Measure AC and DC Fields in Power Systems," in IEEE Transactions on Power Delivery, vol. 24, No. 3, pp. 988-995, Jul. 2009.

(Continued)

*Primary Examiner* — Patrick Assouad
*Assistant Examiner* — Haidong Zhang
(74) *Attorney, Agent, or Firm* — WPAT, PC

(57) ABSTRACT

A power cable measurement device is provided, which may include a casing, a plurality current sensing modules and a plurality of voltage sensing modules. The casing may be used to envelope a three-phase three-wire power cable. The voltage sensing modules and the current sensing modules may be disposed on the casing and spaced at regular intervals; any two adjacent current sensing modules may be divided by one voltage sensing module. The power cable measurement device can accurately estimate the electricity information of the three-phase three-wire power cable according to a characteristic curve database constructed by pre-measurement, the induced voltages of the voltage sensing modules and the induced voltages of the current sensing modules.

19 Claims, 10 Drawing Sheets

(56) References Cited

U.S. PATENT DOCUMENTS

| | | | |
|---|---|---|---|
| 6,671,635 B1 * | 12/2003 | Forth | G01R 35/04 |
| | | | 324/74 |
| 6,731,105 B1 | 5/2004 | Hoyle et al. | |
| 7,164,263 B2 * | 1/2007 | Yakymyshyn | G01R 15/207 |
| | | | 324/117 H |
| 7,330,033 B2 | 2/2008 | Nakamura | |
| 7,528,612 B2 | 5/2009 | Gollhardt et al. | |
| 7,759,931 B2 | 7/2010 | Tsukada et al. | |
| 8,564,281 B2 | 10/2013 | Filatov | |
| 9,007,077 B2 | 4/2015 | El-Essawy et al. | |
| 2004/0149443 A1 | 8/2004 | La Rovere et al. | |
| 2005/0156587 A1 | 7/2005 | Yakymyshyn et al. | |
| 2007/0031618 A1 | 2/2007 | Nakamura | |
| 2011/0074382 A1 | 3/2011 | Patel | |
| 2012/0200291 A1 * | 8/2012 | Carpenter | G01R 1/22 |
| | | | 324/252 |
| 2013/0187635 A1 * | 7/2013 | Cheng | G01R 15/181 |
| | | | 324/126 |
| 2013/0335062 A1 | 12/2013 | de Buda et al. | |
| 2014/0062459 A1 | 3/2014 | El-Essawy et al. | |
| 2014/0300344 A1 | 10/2014 | Turner et al. | |
| 2014/0320125 A1 | 10/2014 | Leeb et al. | |

FOREIGN PATENT DOCUMENTS

| | | |
|---|---|---|
| CN | 103217563 A | 7/2013 |
| TW | 312748 | 8/1997 |
| TW | 498166 | 8/2002 |
| TW | 200630632 | 9/2006 |
| TW | 201120458 | 6/2011 |
| TW | 201241442 | 10/2012 |
| TW | I436068 | 5/2014 |
| TW | I439700 | 6/2014 |
| TW | 201515353 | 4/2015 |
| TW | 201528859 | 7/2015 |

OTHER PUBLICATIONS

Pengfei Yang et al., "A high sensitivity SOI electric-field sensor with novel comb-shaped microelectrodes," in Solid-State Sensors, Actuators and Microsystems Conference (Transducers), 2011 16th International , vol., No., pp. 1034-1037, Jun. 5-9, 2011.

Kobayashi, T. et al., "An electrostatic field sensor driven by self-excited vibration of sensor/actuator integrated piezoelectric micro cantilever," in Micro Electro Mechanical Systems (MEMS), 2012 IEEE 25th International Conference on , vol., No., pp. 527-530, Jan. 29, 2012-Feb. 2, 2012.

Leland, E.S. et al., "A new MEMS sensor for AC electric current," in Sensors, 2010 IEEE , vol., No., pp. 1177-1182, Nov. 1-4, 2010.

Ziegler, S. et al., "Current Sensing Techniques: A Review," in Sensors Journal, IEEE , vol. 9, No. 4, pp. 354-376, Apr. 2009.

* cited by examiner

POWER CABLE MEASUREMENT DEVICE AND MEASUREMENT METHOD THEREOF

CROSS REFERENCE TO RELATED APPLICATION

This application also claims priority to Taiwan Patent Application No. 104123588 filed in the Taiwan Patent Office on Jul. 21, 2015, the entire content of which is incorporated herein by reference.

TECHNICAL FIELD

The present disclosure relates to a power cable measurement device, in particular to a non-contact type power cable measurement device. The present disclosure further relates to the measurement method of the power cable measurement device.

BACKGROUND

In response to the trend of the global energy depletion, people pay more attention to energy-saving; thus, people usually need to measure the electricity information of power cables so as to understand the electricity consumption information and save cost.

The most frequently-used power cable in the industry is three-phase three-wire power cable; if the user wants to use a power cable measurement device to measure the electricity information of the three-phase three-wire power cable of a machine in order to monitor the operation status of the machine, the user should turn off the power supply of the machine in advance; therefore, the machine cannot operate normally during the monitoring process.

Currently, many power cable measurement devices are developed to measure the electricity information of power cables. For example, U.S. Pat. No. 6,373,238 provides a three-phase electrical power measurement system for measuring the electricity information of a three-phase electrical power cable; US patent publication No. 20110074328 provides a whole structure contactless power consumption sensor for measuring the current and the power of a power cable; U.S. Pat. No. 9,007,077 provides a flexible current and voltage sensor for measuring the voltage and the current of a power cable; US patent publication No. 20050156587 provides a current sensor for measuring the current of a power cable. However, the above power cable measurement devices still have many shortcomings to be overcome.

SUMMARY

The present disclosure is related to a power cable measurement device. In one preferred embodiment of the disclosure, the power cable measurement device may include a casing, a plurality current sensing modules and a plurality of voltage sensing modules. The casing may be used to envelope a three-phase three-wire power cable. The voltage sensing modules and the current sensing modules may be disposed on the casing and spaced at regular intervals; any two adjacent current sensing modules may be divided by one voltage sensing module. The power cable measurement device can accurately estimate the input voltage and the input current of the three-phase three-wire power cable according to a characteristic curve database constructed by pre-measurement, the induced voltages of the voltage sensing modules and the induced voltages of the current sensing modules.

The present disclosure is also related to a power cable measurement method. In one preferred embodiment of the disclosure, the power cable measurement method may include the following steps: measuring the induced voltages of a voltage sensing module induced by different voltages, and measuring the induced voltage of a current sensing module induced by different voltages and different currents to construct a characteristic curve database; using the voltage sensing module to sense the input voltage of a three-phase three-wire power cable to generate a first induced voltage; using the current sensing module to sense the input voltage and the input current of the three-phase three-wire power cable to generate a second induced voltage; and calculating an estimation voltage and an estimation current according to the first induced voltage, the second induced voltage and the characteristic curve database.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

Figure 1:
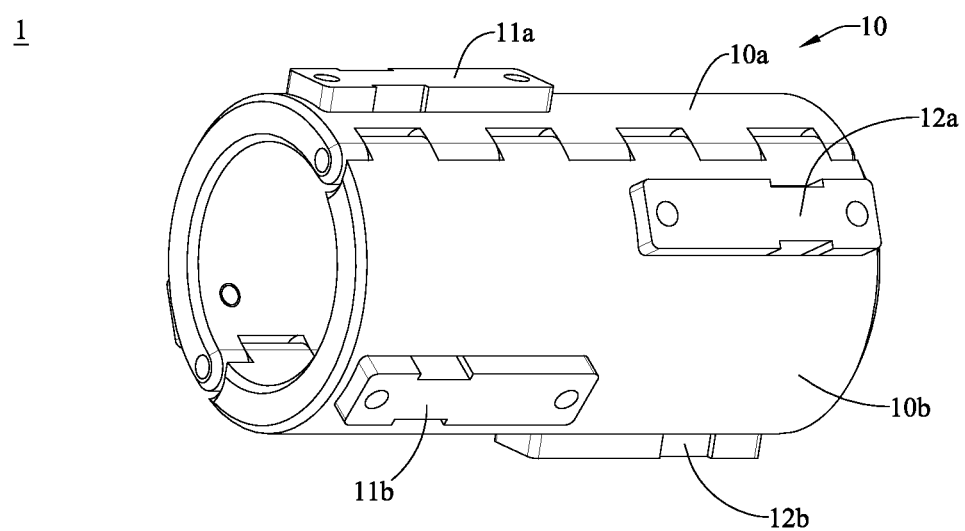
FIG. 1 is the first schematic view of the first embodiment of the non-contact type three-phase three-wire power cable measurement device in accordance with the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1, which is the first schematic view of the first embodiment of the non-contact type three-phase three-wire power cable measurement device in accordance with the present invention. As shown in FIG. 1, the non-contact type three-phase three-wire power cable measurement device 1 may include a casing 10, a plurality of current sensing module 11a, 11b, 11c and a plurality of voltage sensing modules 12a, 12b and 12c. The casing 10 may be shaped like a hollow cylinder for enveloping a three-phase three-wire power cable. The voltage sensing modules 12a, 12b, 12c may be disposed on the casing 10 and spaced at regular intervals; the voltage sensing modules 12a, 12b and 12c may respectively sense the input voltage of the three-phase three-wire power cable to generate three first induced voltages. The current sensing modules 11a, 11b, 11c may be disposed on the casing 10 and spaced at regular intervals; any two adjacent current sensing modules are divided by one voltage sensing module; the current sensing modules 11a, 11b, 11c may respectively sense the input voltage and input current of the three-phase three-wire power cable to generate three second induced voltages.

In the embodiment, the non-contact type three-phase three-wire power cable measurement device 1 may include three current sensing modules 11a, 11b, 11c and three voltage sensing modules 12a, 12b, 12c respectively. The included angle between the adjacent current sensing modules is about 120°; similarly, the included angle between the adjacent voltage sensing modules is about 120°. The voltage sensing modules 12a, 12b, 12c and the current sensing modules 11a, 11b, 11c are spaced at regular intervals, and any two adjacent voltage sensing modules are divided by one current sensing module, so the included angle between any one of the voltage sensing modules 12a, 12b, 12c and the adjacent current sensing module is about 60°. The current sensing modules 11a, 11b, 11c may be disposed at the left half side of the casing 10; the voltage sensing modules 12a, 12b, 12c are disposed at the right half side of the casing 10. However, in another preferred embodiment, the current sensing modules 11a, 11b, 11c and the voltage sensing modules 12a, 12b, 12c may be spaced at regular intervals and simultaneously disposed at the center of the casing 10. However, the above structure is just for example instead of limitation; the present invention will not be limited by the above structure design.

Figure 2:
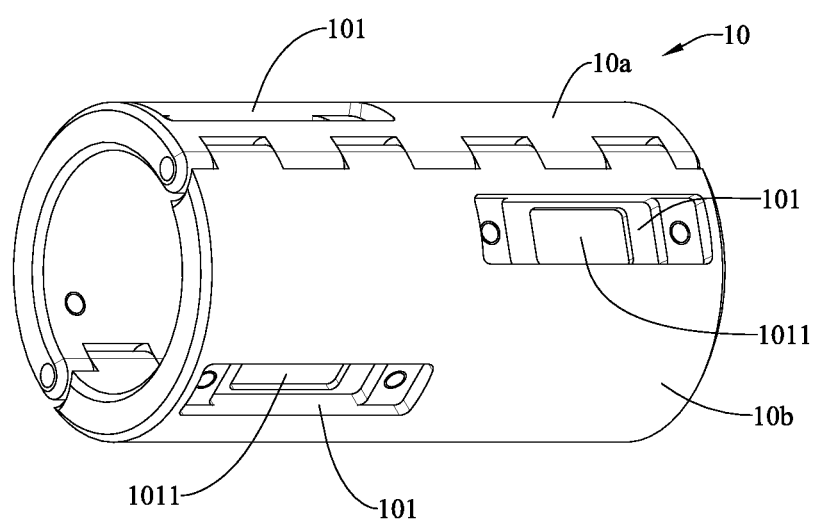
FIG. 2 is the second schematic view of the first embodiment of the non-contact type three-phase three-wire power cable measurement device in accordance with the present invention.
Figure 3:
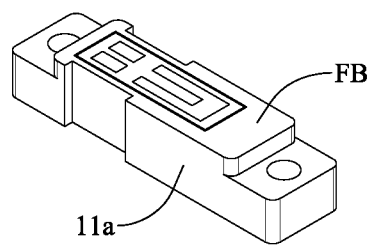
FIG. 3 is the third schematic view of the first embodiment of the non-contact type three-phase three-wire power cable measurement device in accordance with the present invention.

Please refer to FIG. 2 and FIG. 3, which are the second schematic view and the third schematic view of the first embodiment of the non-contact type three-phase three-wire power cable measurement device in accordance with the present invention. As shown in FIG. 2, the casing 10 may consist of an upper casing 10a and a lower casing 10b, which may include six slots 101, and the current sensing modules 11a, 11b, 11c and the voltage sensing modules 12a, 12b, 12c may be disposed at the corresponding slots respectively.

After the current sensing modules 11a, 11b, 11c are installed at the slots 101, one portion of any one of the current sensing modules 11a, 11b, 11c may be inside the slot 101, and the other portion may be protrude from the slot 101; similarly, the voltage sensing modules 12a, 12b, 12c are installed at the slots 101, one portion of any one of the voltage sensing modules 12a, 12b, 12c may be inside the slot 101, and the other portion may protrude from the slot 101, as shown in FIG. 1. As shown in FIG. 2, each of the slots 101 may further include a groove 1011.

As shown in FIG. 3, each of the current sensing modules 11a, 11b, 11c and the voltage sensing modules 12a, 12b, 142c may further include a buckling part FP, which may engage in the groove 1011 of the corresponding slot 101 in order to fix all current sensing modules 11a, 11b, 11c and all voltage sensing modules 12a, 12b, 12c on the casing 10. However, the above structure is just for example instead of limitation; the present invention will not be limited by the above structure design.

Figure 4:
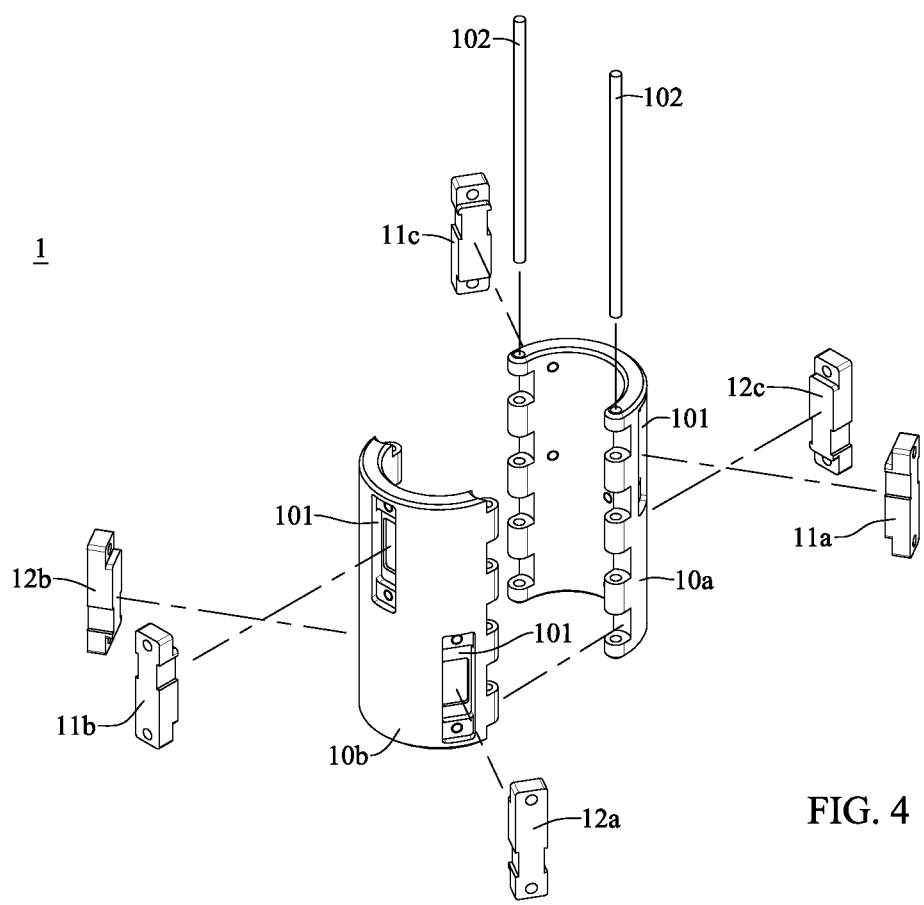
FIG. 4 is the fourth schematic view of the first embodiment of the non-contact type three-phase three-wire power cable measurement device in accordance with the present invention.

Please refer to FIG. 4, which is the fourth schematic view of the first embodiment of the non-contact type three-phase three-wire power cable measurement device in accordance with the present invention. As shown in FIG. 4, the casing 10 may consist of an upper casing 10a and a lower casing 10b; one side of the upper casing 10a may be pivotally connected to one side of the lower casing 10b via a shaft 102; similarly, the other side of the upper casing 10a may be also pivotally connected to the other side of the lower casing 10b via a shaft 102. The current sensing modules 11a, 11b, 11c may be disposed at the corresponding slots 101 at the left half side of the casing 10; the voltage sensing modules 12a, 12b, 12c may be disposed at the corresponding slots 101 at the right half side of the casing 10. However, the above structure is just for example instead of limitation; the present invention will not be limited by the above structure.

Figure 5:
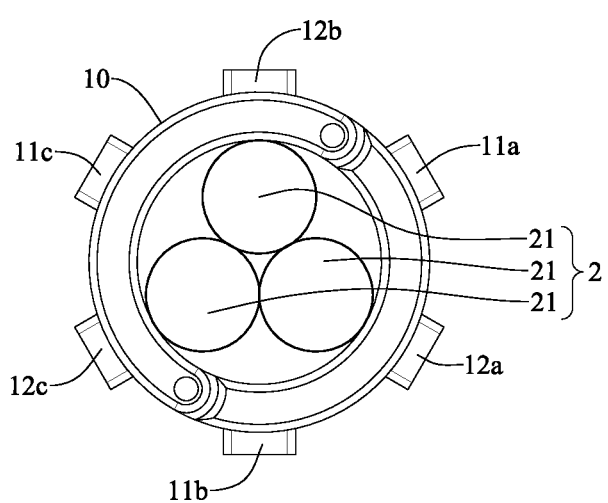
FIG. 5 is the fifth schematic view of the first embodiment of the non-contact type three-phase three-wire power cable measurement device in accordance with the present invention.

Please refer to FIG. 5, which is the fifth schematic view of the first embodiment of the non-contact type three-phase three-wire power cable measurement device in accordance with the present invention; FIG. 5 shows the front view of the first embodiment of the non-contact type three-phase three-wire power cable measurement device in accordance with the present invention. As shown in FIG. 5, for the purpose of achieving better performance, the position of each of the current sensing modules 11a, 11b, 11c may be corresponding to the center of the adjacent copper core cables to be away from the copper core cables; on the contrary, the position of each of the voltage sensing modules 12a, 12b, 12c may be corresponding to the position of one of the copper core cables to be close to the copper core cable. In this way, the induced voltages of all current sensing modules 11a, 11b, 11c and all voltage sensing modules 12a, 12b, 12c can be maximized to improve the accuracy of the non-contact type three-phase three-wire power cable measurement device 1. However, the above structure is just for example instead of limitation; the present invention will not be limited by the above structure.

Besides, the current sensing modules 11a, 11b, 11c and the voltage sensing modules 12a, 12b, 12c may be further connected to a processing module (not shown in the drawings); thus, the processing module may estimate the input voltage and input current of the three-phase three-wire power cable 2 according to the three first induced voltages of the voltage sensing modules 12a, 12b, 12c, the three second induced voltages of the current sensing modules 11a, 11b, 11c and a characteristic curve database so as to generate three estimation voltages and three estimation currents. In addition, the processing module may be further connected to a display module 13, which may display the three estimation voltages and the three estimation currents respectively. In this way, the non-contact type three-phase three-wire power cable measurement device 1 can precisely estimate the input voltage and the input current of the three-phase three-wire power cable 2 without contacting the three-phase three-wire power cable 2. Therefore, it is not necessary to remove the PVC skin of the three-phase three-wire power cable or pull out the three-phase three-wire power cable from the distribution box.

It is worthy to point out that if the user needs to use a conventional power cable measurement device to measure the electricity information of the three-phase three-wire power cable of a machine, the user should remove the PVC skin of the three-phase three-wire power cable or pull out the three-phase three-wire power cable from the distribution box in advance; therefore, the power supply of the machine should be turned off, which is very inconvenient for the user and cannot satisfy the requirements of the industry. On the contrary, in one embodiment of the present invention, the user can use the non-contact type three-phase three-wire power cable measurement device to directly envelope the three-phase three-wire power cable of a machine so as to measure its electricity information; in this way, the user does not have to remove the PVC skin of the three-phase three-wire power cable and does not have to turn off the power supply of the machine, which is more convenient for the user and can satisfy the requirements of the industry.

Moreover, the user may need to connect the conventional power cable measurement device to a breaker box or other devices before using the conventional power cable measurement device to measure the electricity information of the three-phase three-wire power cable, which will increase the cost of the conventional power cable measurement device. On the contrary, in one embodiment of the present invention, the non-contact type three-phase three-wire power cable measurement device can be independently installed on the three-phase three-wire power cable without connecting to a breaker box or other devices; thus, the cost of the non-contact type three-phase three-wire power cable measurement device can be reduced.

Furthermore, in one embodiment of the present invention, the current sensing modules and the voltage sensing modules of the non-contact type three-phase three-wire power cable measurement device have special structure design, which can effectively better the accuracy of the non-contact type three-phase three-wire power cable measurement device; accordingly, the non-contact type three-phase three-wire power cable measurement device can achieve higher performance. As described above, the present invention definitely has an inventive step.

Figure 6:
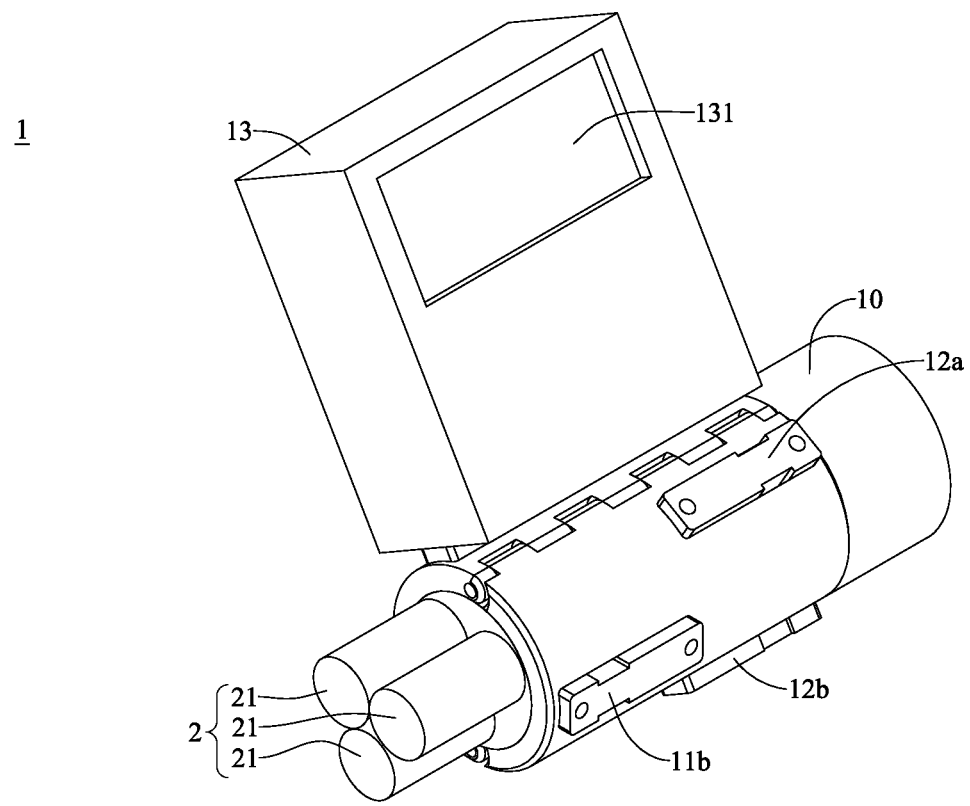
FIG. 6 is the schematic view of the second embodiment of the non-contact type three-phase three-wire power cable measurement device in accordance with the present invention.

Please refer to FIG. 6, which is the schematic view of the second embodiment of the non-contact type three-phase three-wire power cable measurement device in accordance with the present invention. As shown in FIG. 6, the non-contact type three-phase three-wire power cable measurement device 1 may include a casing 10, a plurality of current sensing module 11a, 11b, 11c and a plurality of voltage sensing modules 12a, 12b and 12c. Similarly, the casing 10 may be shaped like a hollow cylinder for enveloping a three-phase three-wire power cable 2. The voltage sensing modules 12a, 12b, 12c may be disposed on the casing 10 and spaced at regular intervals; the voltage sensing modules 12a, 12b and 12c may respectively sense the input voltage of the three-phase three-wire power cable to generate three first induced voltages. The current sensing modules 11a, 11b, 11c may be disposed on the casing 10 and spaced at regular intervals; any two adjacent current sensing modules are divided by one voltage sensing module; the current sensing modules 11a, 11b, 11c may respectively sense the input voltage and input current of the three-phase three-wire power cable to generate three second induced voltages. The display module 13 may be fixed on the casing 10, and electrically connected to the current sensing modules 11a, 11b, 11c and the voltage sensing modules 12a, 12b, 12c; the display module 13 may include a display screen 131; besides, the display module 13 may further include a processing module, a circuit and other circuit components (not shown in the drawings).

The processing module may calculate the estimation voltages and the estimation currents of the three-phase three-wire power cable 2 according to the three first induced voltages o the voltage sensing modules 12a, 12b, 12c, the three second induced voltages of the current sensing modules 11a, 11b, 11c and a characteristic curve database; then, the display screen 131 of the display module 13 may display the estimation currents and the estimation voltages.

Figure 7:
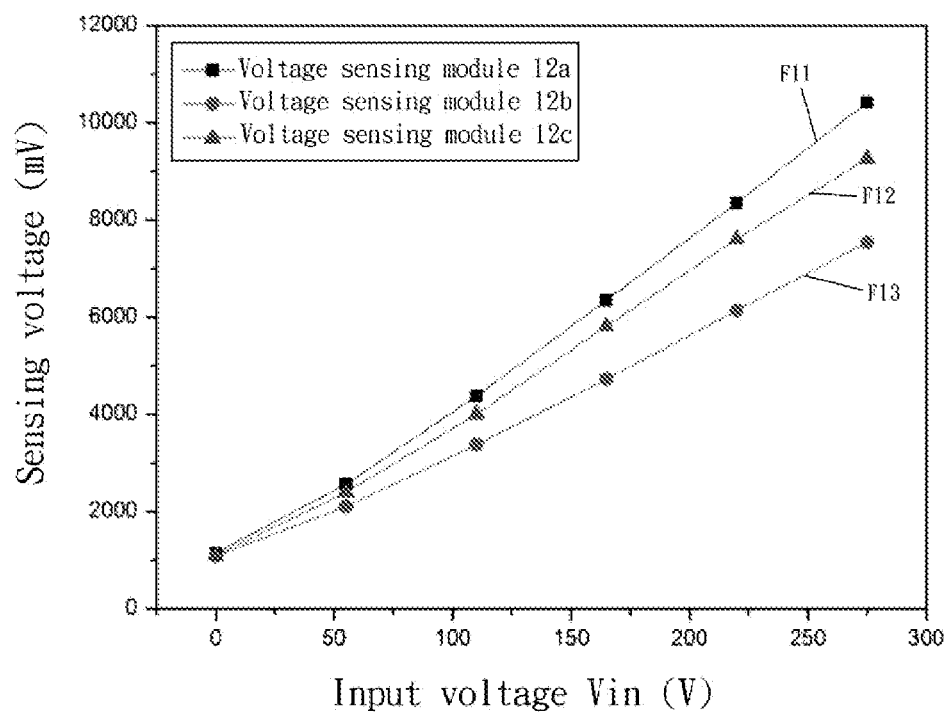
FIG. 7 is the first schematic view of the first embodiment of the power cable measurement method in accordance with the present invention.
Figure 8:
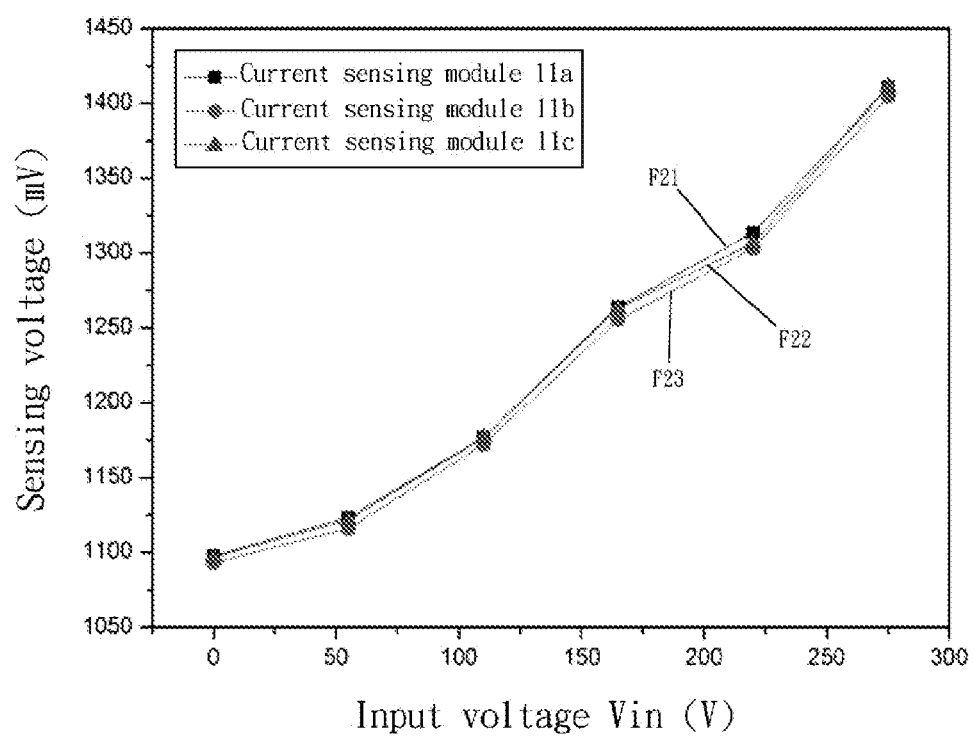
FIG. 8 is the second schematic view of the first embodiment of the power cable measurement method in accordance with the present invention.
Figure 9:
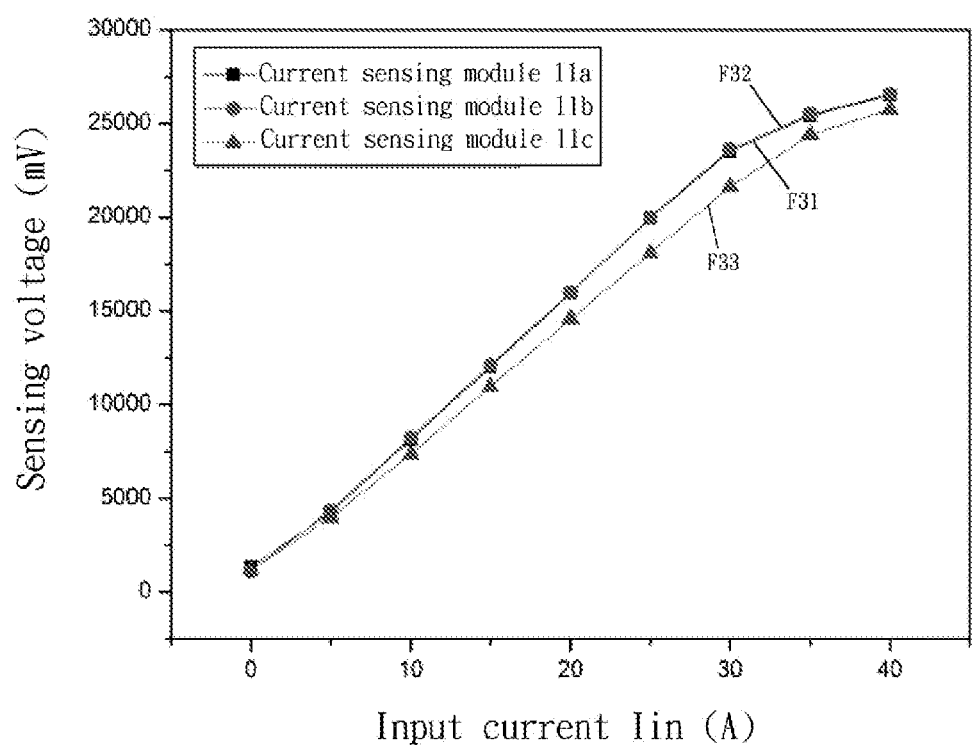
FIG. 9 is the third schematic view of the first embodiment of the power cable measurement method in accordance with the present invention.

Please refer to FIG. 7, FIG. 8 and FIG. 9, which are the first schematic view, the second schematic view and third schematic view of the first embodiment of the power cable measurement method in accordance with the present invention. According to the previous embodiment, the processing module of the non-contact type three-phase three-wire power cable measurement device 1 may estimate the input voltage $V_{in}$ and input current $I_{in}$ of the three-phase three-wire power cable to generate estimation voltages and estimation currents according to the three first induced voltages $V_{v1}$, $V_{v2}$, $V_{v3}$ of the voltage sensing modules 12a, 12b, 12c, the second induced voltages $V_{I1}$, $V_{I2}$, $V_{I3}$ of the current sensing module 11a, 11b, 11c and a characteristic curve database; the characteristic curve database may be constructed by pre-measurement.

For the purpose of precisely estimating the input voltage $V_{in}$ and the input current $I_{in}$, the tester may measure the characteristic curves of the induced voltages of all current sensing modules 11a, 11b, 11c and voltage sensing modules 12a, 12b, 12c induced by different voltages and different currents within a certain distance via a pre-measurement process so as to construct the characteristic curve database.

For example, the tester may use the voltage sensing module 12a to sense the three-phase three-wire power cable 2 with different input voltages $V_{in}$ and record the induced voltages $V_{v1}$ of the voltage sensing module 12a to construct a first characteristic curve formula F11, which may be "$V_{in}=F11(V_{v1})$". Similarly, the tester may construct the first characteristic curve formulas of the voltage sensing module 12b, 12c by the same process, which may be "$V_{in}=F12(V_{v2})$" and "$V_{in}=F13(V_{v3})$" respectively, as shown in FIG. 7.

Next, the tester may use the current sensing module 11a to sense the three-phase three-wire power cable 2 with different input voltages $V_{in}$ and record the induced voltages $V_{IV1}$ of the current sensing module 11a to construct a second characteristic curve formula F21, which may be "$V_{IV1}=F21(V_{in})$". Similarly, the tester may construct the second characteristic curve formulas of the current sensing module 11b, 11c by the same process, which may be "$V_{IV2}=F22(V_{in})$" and "$V_{IV3}=F23(V_{in})$" respectively, as shown in FIG. 8.

Afterward, the tester may use the current sensing module 11a to sense the three-phase three-wire power cable 2 with different input current $I_{in}$ and record the induced voltages $V_{II1}$ of the current sensing module 11a to construct a third characteristic curve formula F31, which may be "$I_{in}=F31(V_{II1})$". Similarly, the tester may construct the third characteristic curve formulas of the current sensing module 11b, 11c by the same process, which may be "$I_{in}=F32(V_{II2})$" and "$I_{in}=F33(V_{II3})$" respectively, as shown in FIG. 9.

Finally, the characteristic curve database may be constructed by integrating the aforementioned characteristic curve formulas. Thus, when actually measuring the three-phase three-wire power cable 2, the processing module may estimate the input voltage $V_{in}$ and input current $I_{in}$ of the three-phase three-wire power cable 2 to generate estimation voltages $V_{E1}$, $V_{E2}$, $V_{E3}$ and estimation currents $I_{E1}$, $I_{E2}$, $I_{E3}$ according to the three first induced voltages $V_{v1}$, $V_{v2}$, $V_{v3}$ of the voltage sensing modules 12a, 12b, 12c, the second induced voltages $V_{I1}$, $V_{I2}$, $V_{I3}$ of the current sensing module 11a, 11b, 11c and the characteristic curve database.

For example, when actually measuring the input voltage $V_{in}$ and input current $I_{in}$ of the three-phase three-wire power cable 2, the processing module may calculate the estimation value (i.e. estimation voltage $V_{E1}$) of the input voltage $V_{in}$ according to the induced voltage $V_{v1}$ of the voltage sensing module 12a and the first characteristic curve formula "$V_{in}=F11(V_{v1})$". Next, the processing module may calculate the induced voltage $V_{IV1}$ of the current sensing module 11a induced by the input voltage $V_{in}$ according to the estimation voltage $V_{E1}$ and the second characteristic curve "$V_{IV1}=F21(V_{in})$". Afterward, the processing module may deduct the induced voltage $V_{IV1}$ of the current sensing module 11a induced by the input voltage $V_{in}$ from the second induced voltage $V_{I1}$ of the current sensing module 11a so as to obtain the induced voltage $V_{II1}$ of the current sensing module 11a induced by the input current $I_{in}$ (the second induced voltage $V_{I1}$ of the current sensing module 11a is the sum of the induced voltage $V_{IV1}$ of the current sensing module 11a induced by the input voltage $V_{in}$ and the induced voltage $V_{II1}$ of the current sensing module 11a induced by the input current $I_{in}$). Finally, the processing module calculate the estimation value (i.e. estimation current $I_{E1}$) of the input current $I_{in}$ according to the induced voltage $V_{II1}$ of the current sensing module 11a induced by the input current $I_{in}$ and the third characteristic curve formula "$I_{in}=F31(V_{II1})$".

Similarly, the processing module may also calculate the estimation voltages $V_{E2}$, $V_{E3}$ of the input voltage $V_{in}$ and the estimation currents $I_{E2}$, $I_{E3}$ of the input current $I_{in}$ according to the first induced voltage $V_{IV2}$, $V_{IV3}$ of the voltage sensing module 12b, 12c, the second induced voltage $V_{I2}$, $V_{I3}$ of the current sensing module 11b, 11c and the characteristic curve database. As described above, the characteristic curve database constructed by the pre-measurement can accurately estimate the input voltage $V_{in}$ and input current $I_{in}$ of the three-phase three-wire power cable 2. However, the above method is just for example instead of limitation; the present invention will not be limited by the above method.

Figure 10:
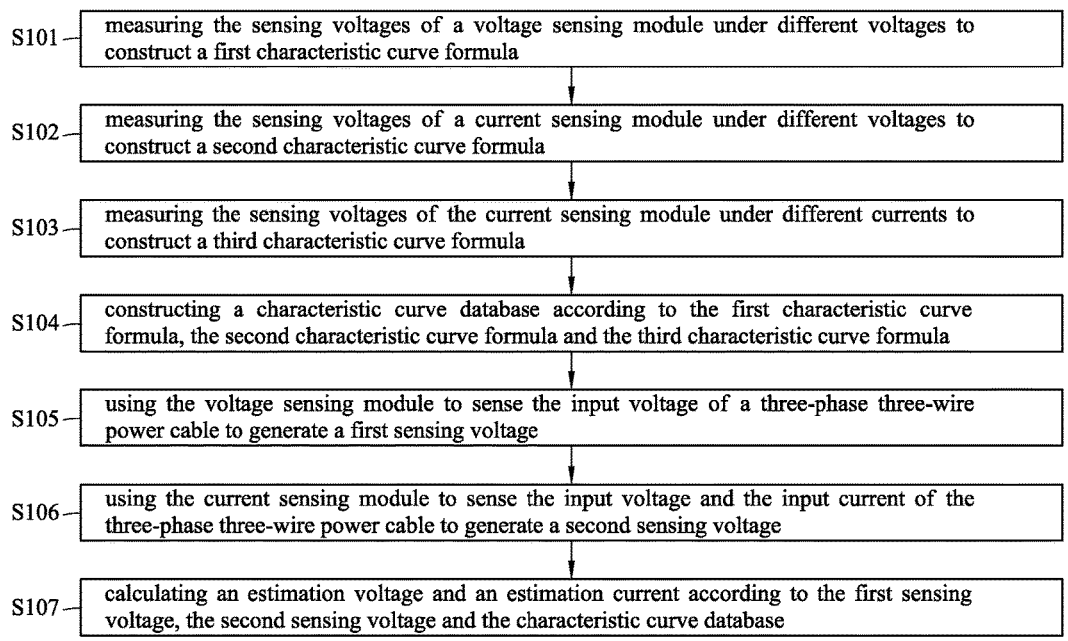
FIG. 10 is the flow chart of the first embodiment of the power cable measurement method in accordance with the present invention.

Please refer to FIG. 10, which is the flow chart of the first embodiment of the power cable measurement method in accordance with the present invention; the embodiment may include the following steps:

In Step S101: measuring the induced voltages of a voltage sensing module induced by different voltages to construct a first characteristic curve formula.

In Step S102: measuring the induced voltages of a current sensing module induced by different voltages to construct a second characteristic curve formula.

In Step S103: measuring the induced voltages of the current sensing module induced by different currents to construct a third characteristic curve formula.

In Step S104: constructing a characteristic curve database according to the first characteristic curve formula, the second characteristic curve formula and the third characteristic curve formula.

In Step S105: using the voltage sensing module to sense the input voltage of a three-phase three-wire power cable to generate a first induced voltage.

In Step S106: using the current sensing module to sense the input voltage and the input current of the three-phase three-wire power cable to generate a second induced voltage.

In Step S107: calculating an estimation voltage and an estimation current according to the first induced voltage, the second induced voltage and the characteristic curve database.

In summation of the description above, the non-contact type three-phase three-wire power cable measurement device and the measurement method thereof in accordance with the embodiments of the present invention may have the following advantages:

(1) In one embodiment of the present invention, the non-contact type three-phase three-wire power cable measurement device is applicable to three-phase three-wire power cable; thus, its application range is more comprehensive.

(2) In one embodiment of the present invention, the non-contact type three-phase three-wire power cable measurement device can directly envelope a three-phase three-wire power cable to measure the electricity information of the three-phase three-wire power cable without contacting the three-phase three-wire power cable; therefore, the user does not have to remove the PVC skin of the three-phase three-wire power cable, does not have to pull out the three-phase three-wire power cable from the distribution box or turns off the power supply of the machine, which is more convenient in use.

(3) In one embodiment of the present invention, the non-contact type three-phase three-wire power cable measurement device can directly and contactlessly measure the electricity information of the three-phase three-wire power cable of a machine; thus, it is not necessary for the user to turn off the power supply of the machine when measuring its electricity information. In this way, the user can monitor the real-time operation status of the machine without influencing the operation of the machine, which can satisfy the requirements of the industry.

(4) In one embodiment of the present invention, the non-contact type three-phase three-wire power cable measurement device can independently be installed at a three-phase three-wire power cable without connected to a breaker box or other devices; thus, the cost of the non-contact type three-phase three-wire power cable measurement device can be further decreased.

(5) In one embodiment of the present invention, the non-contact type three-phase three-wire power cable measurement device has special structure design, which can effectively enhance the accuracy of the non-contact type three-phase three-wire power cable measurement device to batter its performance.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A power cable measurement device, for measuring a power cable, comprising:
  a hollow and cylindrical casing, enveloping said power cable, wherein said casing has a first end, a plurality of first end slots positioned on an outer surface of said casing and adjacent to said first end, a second end, and a plurality of second end slots positioned on the outer surface of said casing and adjacent to said second end;
a plurality of current sensing modules, being disposed in said plurality of first end slots and spaced at a first angular interval; and
a plurality of voltage sensing modules, being disposed in said plurality of second end slots and spaced at a second angular interval;
wherein said plurality of current sensing modules includes a first current sensing module, said plurality of voltage sensing modules includes a first voltage sensing module and a second voltage sensing module, and said first current sensing module is aligned to a midpoint between said first voltage sensing module and said second voltage sensing module.

2. The power cable measurement device of claim 1, wherein said casing comprises a first half and a second half, and said first half and second half are engaged together with zigzag edges.

3. The power cable measurement device of claim 1, wherein said first angular interval and said second angular interval are equal.

4. The power cable measurement device of claim 1, wherein each of the slots further comprises a groove.

5. The power cable measurement device of claim 4, wherein each of the current sensing modules and the voltage sensing module comprises a protrusion, and the protrusion engages with the corresponding groove.

6. The power cable measurement device of claim 1, wherein the voltage sensing modules sense an input voltage to the power cable to generate a plurality of first induced voltages.

7. The power cable measurement device of claim 6, wherein the current sensing modules sense an input voltage and an input current to the power cable to generate a plurality of second induced voltages.

8. The power cable measurement device of claim 7, further comprising a processing module, wherein the processing module calculates a plurality of estimation voltages and a plurality of estimation currents according to the first induced voltages of the voltage sensing modules, the second induced voltages of the current sensing modules and a characteristic curve database.

9. The power cable measurement device of claim 8, further comprising a displaying module, wherein the displaying module displays the estimation currents and the estimation voltages.

10. A power cable measurement method, comprising the following steps:
providing a casing, hollow and cylindrical in shape, to be used to envelop a three-wire power cable, wherein said casing has a first end, a plurality of first end slots positioned on an outer surface of said casing and adjacent to said first end, a second end, and a plurality of second end slots positioned on the outer surface of said casing and adjacent to said second end;
disposing a plurality of current sensing modules in said plurality of first end slots on the casing and spacing the current sensing modules at a first plurality of regular angular intervals;
disposing a plurality of voltage sensing modules in said plurality of second end slots on the casing and spacing the voltage sensing modules at a second plurality of regular angular intervals, wherein any two adjacent voltage sensing modules are divided by one current sensing module, and any two adjacent current sensing modules are divided by one voltage sensing module;
constructing a characteristic curve database with a processor by enveloping the three-wire power cable with the casing, measuring and recording induced voltages of each of the voltage sensing modules induced by different voltages applied on the three-wire power cable, and measuring and recording induced voltages of each of the current sensing modules induced by different voltages and different currents applied on the three-wire power cable; and
estimating an input voltage and an input current applied on the three-wire power cable by following steps:
enveloping the three-wire power cable with the casing;
generating first induced voltages by using each of the voltage sensing modules when sensing the input voltage of the three-wire power cable;
generating second induced voltages by using each of the current sensing modules when sensing the input voltage and the input current of the three-wire power cable; and
calculating by a processor an estimation voltage and an estimation current on the three-wire power cable according to the first induced voltages, the second induced voltages, and the characteristic curve database.

11. The power cable measurement method of claim 10, further comprising the following step:
constructing a first characteristic curve formula by measuring the induced voltages from each of the voltage sensing modules induced by different voltages applied on the three-wire power cable.

12. The power cable measurement method of claim 11, further comprising the following step:
constructing a second characteristic curve formula by measuring the induced voltages from each of the current sensing modules induced by different voltages applied on the three-wire power cable.

13. The power cable measurement method of claim 12, further comprising the following step:
constructing a third characteristic curve formula by measuring the induced voltages from each of the current sensing modules induced by different currents applied on the three-wire power cable.

14. The power cable measurement method of claim 13, further comprising the following step:
constructing the characteristic curve database according to the first characteristic curve formula, the second characteristic curve formula, and the third characteristic curve formula.

15. The power cable measurement method of claim 14, further comprising the following step:
calculating by the processor the estimation voltage of the three-wire power cable according to the first characteristic curve formula and the first induced voltages.

16. The power cable measurement method of claim 15, further comprising the following step:
calculating by the processor induced voltages of the current sensing modules induced by the input voltage applied on the three-wire power cable according to the second characteristic curve formula and the estimation voltage.

17. The power cable measurement method of claim 16, further comprising the following step:
deducting by the processor the induced voltages of the current sensing modules induced by the input voltage from the second induced voltage to obtain induced voltages of the current sensing modules induced by the input current.

18. The power cable measurement method of claim 17, further comprising the following step:

calculating by the processor the estimation current of the three-wire power cable according to the third characteristic curve formula and the induced voltages of the current sensing modules induced by the input current applied on the three-wire power cable.

19. The power cable measurement method of claim 18, further comprising the following step:

displaying the estimation voltage and the estimation current on a display screen.

* * * * *